United States Patent [19]

Taguchi et al.

[11] Patent Number: 4,931,945
[45] Date of Patent: Jun. 5, 1990

[54] METHOD OF CONTROLLING FLOATING ZONE

[75] Inventors: Kenichi Taguchi, Joetsu; Masataka Watanabe, Nigata, both of Japan

[73] Assignee: Shin-Etsu Handotai Company Limited, Tokyo, Japan

[21] Appl. No.: 280,695

[22] Filed: Dec. 5, 1988

[30] Foreign Application Priority Data

Dec. 5, 1987 [JP] Japan .................. 62-308277

[51] Int. Cl.$^5$ .................. H05B 5/00; H05B 5/08
[52] U.S. Cl. .................. 364/477; 219/10.43; 219/10.77; 373/139; 156/615; 156/617.1; 382/8
[58] Field of Search .................. 364/477; 219/10.41, 219/10.43, 10.67, 10.75, 10.77; 373/138, 139; 382/8; 356/384; 156/604, 608, 615, 617.1

[56] References Cited

U.S. PATENT DOCUMENTS

| 2,992,311 | 7/1961 | Keller | 219/10.43 |
| 3,198,929 | 8/1965 | Stut | 219/10.43 |
| 3,243,509 | 4/1966 | Stut | 373/139 |
| 3,757,071 | 9/1973 | Stut | 219/10.43 |
| 3,814,827 | 6/1974 | Stut | 373/139 |
| 4,162,367 | 7/1979 | Ticak et al. | 373/139 |

Primary Examiner—Allen MacDonald
Attorney, Agent, or Firm—Browdy and Neimark

[57] ABSTRACT

A method of controlling a floating zone applied to a crystal manufacturing system based on the FZ method and designed to enable the diameter at the crystallization boundary and the axial length of the floating zone or other similar quantities to desired values, in which a floating zone (20) is imaged with an imaging device (30); geometric quantities of the floating zone is measured from the image thereby obtained; the electric power (P) supplied to an induction heating coil (12) and the speed ($V_p$) at which a raw-material rod (16) is moved relative to the induction heating coil so that the geometric quantities become equal to desired values. The geometric values include one $Z_i$ of the axial length of the floating zone, the distance (L) between the induction heating coil and a crystallization boundary (24) and the diameter ($D_n$) of a melt neck portion located on the side of the crystallization boundary at a predetermined distance from the induction heating coil, and one $D_i$ of the diameter ($D_s$) of the crystallization boundary and the diameter ($D_m$) of a melt shoulder portion (34) located between the crystallization boundary and the restricted portions at a predetermined distance ($h_m$) from the crystallization boundary.

10 Claims, 3 Drawing Sheets

METHOD OF CONTROLLING FLOATING ZONE

BACKGROUND OF THE INVENTION

1. Field of the Invention

This invention relates to a method of controlling a floating zone applied to a crystal manufacturing system based on the FZ (floating zone) method.

2. Description of the Prior Art

In floating zone control, it is particularly important to control the diameter of the crystal rod at the crystallization boundary. If the response performance and the stability of control of the crystal diameter at the crystallization boundary are inadequate, disturbance of crystal growth takes place and makes the resulting product defective. Even if the formation of any defective products can be avoided, the length of a conical portion which cannot be salable as the product may become excessively large, and irregularities in the surface of the major cylindrical portion of the crystal rod in the axial direction and, hence, the depth to which the surface of the cylindrical portion is ground to eliminate such irregularities may be increased, resulting in an increase in the manufacturing loss.

Where only the crystal diameter at the crystallization boundary is controlled, an unmelted conical portion in the floating zone projecting from the lower end surface of the raw-material rod becomes closer to the upper end surface of the growing crystal rod if the axial length of the floating zone becomes very short. In this state, the upper end surface of the crystal rod is decreased in temperature at its center relative to that of its peripheral portion and thereby crystallographic disturbances often occur, and furthermore, there is a possibility of the lower end of the unmelted conical portion becoming fixed to the upper end surface of the crystal rod, which makes it impossible to continue to grow the crystal. If the axial length of the floating zone becomes excessively large, the floating zone may be broken by spilling over.

If the electric power supplied to the induction heating coil is changed, both the crystal diameter at the crystallization boundary and the axial length of the floating zone are changed. Also, these quantities are changed in response to a change in the speed at which the raw-material rod is moved downward relative to the induction heating coil.

As described above, the fundamental subject of the conventional floating zone control method is to optimize the control of the above-mentioned power supply and the above-mentioned relative speed so as to enable the crystal diameter at the crystallization boundary and the axial length of the floating zone or other similar quantities to become approximated to desired values stably and promptly. Many attempts have been made to improve the method in this respect.

SUMMARY OF THE INVENTION

In view of these problems, it is an object of the present invention to provide a floating zone control method which enables the crystal diameter at the crystallization boundary and the axial length of the floating zone or other similar quantities to become approximated to desired values stably and promptly.

To this end, the present invention provides a method of controlling a floating zone, including the steps of: supplying a high frequency current to an induction heating coil to form a melt from a raw-material rod from one side thereof so that a crystal rod crystallizes and grows from the melt; axially moving the raw-material rod toward the melting side and the crystal rod in the direction opposite to the melting side relative to the induction heating coil; imaging, with an imaging device, a floating zone having a thin portion and formed between the rods; measuring geometric quantities of the floating zone from the image obtained by the imaging device; and controlling the electric power (P) supplied to the induction heating coil and the speed ($V_p$) at which the raw-material rod is moved downward relative to the induction heating coil so that the geometric quantities become equal to desired values, the method being characterized in that the above geometric values include one $Z_i$ of the axial length of the floating zone, the distance (L) between the induction heating coil and a crystallization boundary and the diameter ($D_n$) of a melt neck portion located on the side of the crystallization boundary at a predetermined distance from the induction heating coil, and one $D_i$ of the diameter ($D_s$) of the crystallization interface and the diameter ($D_n$) of a melt shoulder portion located between the crystallization boundary and the thin portion at a predetermined distance from the crystallization boundary, and that if a desired value of $Z_i$ is $Z_o$, a desired value of $D_i$ is $D_o$ and $M=(Z_i-Z_o)(D_i-D_o)$, the contribution of control of the relative speed ($V_p$) is smaller when $Z_i=Z_o$ and $D_i=D_o$ are not satisfied substantially and $M>0$ than it is when $Z_i=Z_o$ and $D_i=D_o$ are satisfied substantially, and the contribution of control of the electric power (P) is smaller when $Z_i=Z_o$ and $D_i=D_o$ are not satisfied substantially and $M<0$ than it is when $Z_i=Z_o$ and $D_i=D_o$ are satisfied substantially.

There are two points specifically considered in the present invention.

(A) The speed of response of $D_i$ to a change in the relative speed $V_p$ of the raw-material rod is far greater than the speed of response of $D_i$ to a change in the supplied power P; and (B) Even if the control deviation of $Z_i$ is increased to a certain small extent, the overall control performance can be improved as long as this increase in the control deviation of $Z_i$ enables a reduction in the control deviation of $D_i$ to be reduced because the allowable control deviation of $Z_i$ is comparatively large.

The processing in accordance with the present invention will be described below with respect to four cases in which $Z_i=Z_o$ and $D_i=D_o$ are not satisfied substantially.

(1) where $Z_i>Z_o$ and $D_i>D_o$, as the supplied power P is reduced in order to reduce $D_i$, $Z_i$ is correspondingly reduced; and when the relative speed $V_p$ is increased in order to reduce $Z_i$, the increase in the relative speed $V_p$ (increase in $D_i$) is limited because the contribution of the relative speed control becomes smaller, and the influence of the reduction in the supplied electric power on $D_i$ thereby becomes apparently greater.

Thus, $D_i$ rapidly decreases and converges to the desired value $D_o$.

(2) where $Z_i>Z_o$ and $D_i<D_o$, as the relative speed $V_p$ is increased in order to reduce $Z_i$ (the raw-material supply rate is increased), $D_i$ rapidly increases; and when the supplied power P is increased in order to increase $D_i$, any excessive increase in $D_i$ is inhibited since the contribution of the power control becomes smaller.

Thus, $D_i$ rapidly and stably converges to the desired value $D_o$.

(3) where $Z_i < Z_o$ and $D_i > D_o$, as the relative speed $V_p$ is reduced in order to increase $Z_i$ (the raw-material supply rate is reduced), $D_i$ rapidly decreases; and when the supplied power P is reduced in order to reduce $D_i$, any excessive reduction in the supplied electric power P is inhibited since the contribution of the power control becomes smaller.

Thus, $D_i$ rapidly and stably converges to the desired value $D_o$.

(4) where $Z_i < Z_o$ and $D_i < D_o$, as the supplied electric power P is increased in order to increase $D_i$, $Z_i$ correspondingly increases; and when the relative speed $V_p$ is reduced in order to increase $Z_i$, the reduction in the relative speed $V_p$ (reduction in $D_i$) is limited because the contribution of the relative speed control becomes smaller, and the influence of the increase in the supplied electric power on $D_i$ thereby becomes apparently greater.

Thus, $D_i$ rapidly increases and converges to the desired value $D_o$.

The zone length L also approaches the desired value $Z_o$ in the cases (1) to (4). However, this approach is sacrificed by the above operation of approximating $D_i$ to the desired value $D_o$ stably and rapidly, and the control deviation of $Z_i$ becomes slightly larger. However, there is no problem since the the allowable control deviation of $Z_i$ is comparatively large. Thus, the present invention enables an improvement in the overall effect and makes it possible to minimize the length of the conical portion which cannot be utilized as the product while preventing the melt in the floating zone from spilling over. The present invention also makes it possible to reduce irregularities formed in the surface of the major cylindrical portion in the axial direction and, hence, the depth to which the surface of the cylindrical portion is polished to eliminate such irregularities.

BRIEF DESCRIPTION OF THE DRAWINGS

FIGS. 1 to 4 illustrate an embodiment of the present invention;

DESCRIPTION OF THE PREFERRED EMBODIMENT

Figure 1:
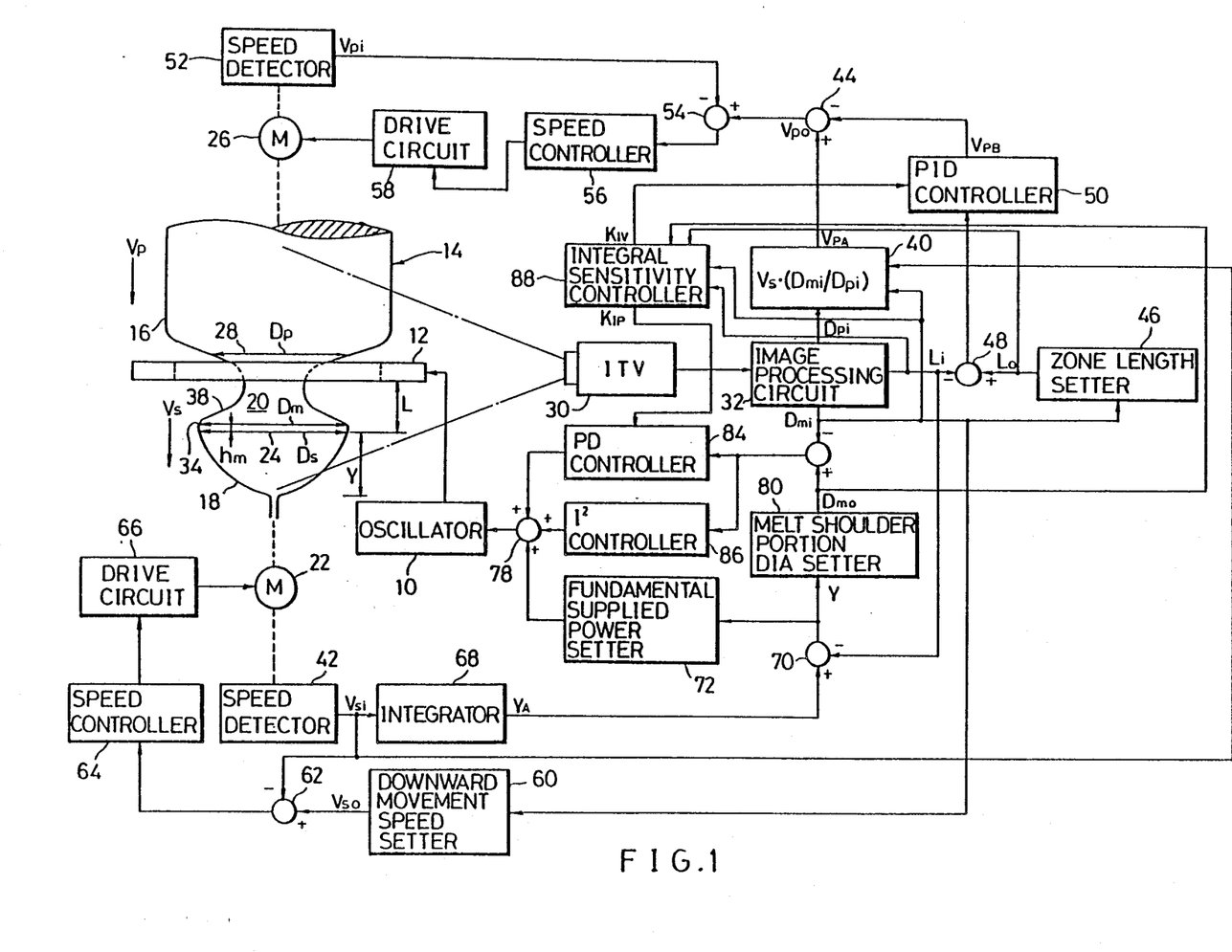
FIG. 1 is a block diagram of an apparatus for controlling the floating zone.

An embodiment of the present invention will be described below with reference to the accompanying drawings. FIG. 1 schematically shows the entire construction of a floating zone control apparatus for use in a crystal manufacturing system based on the FZ method.

The essentials of the present invention will be described mainly in a section of [integral sensitivity control]. However, arrangements relating to this control will be described prior to this section.

An oscillator 10 supplies a high-frequency current to an induction heating coil 12 to heat and melt a raw-material rod 16, e.g., a polycrystalline silicon rod, and a crystal rod 18, e.g., a silicon monocrystalline rod crystallizes and grows from the melt. At this time, a floating zone 20 is formed between the raw-material rod 16 and the crystal rod 18.

The monocrystalline rod 18 is vertically disposed and is moved downward at a velocity $V_s$ by an adjustable-speed motor 22 adapted to move this rod in the vertical direction. The monocrystalline rod 18 is rotated around its center axis by a motor (not shown) at a constant speed so that the temperature distribution over a portion which includes an boundary 24 between the crystal rod 18 and the floating zone 20 is in a rotation symmetry.

The raw-material rod 16 is also vertically disposed and is moved downward at a velocity $V_p$ by a adjustable-speed motor 26 adapted to move the raw-material rod 16 in the vertical direction. The raw-material rod 16 is rotated by a motor (not shown) at a constant speed so that the temperature distribution over a portion which includes an boundary 28 between the raw-material rod 16 and the floating zone 20 is in a rotation symmetry.

The floating zone 20 and a region containing this zone are monitored with a fixed industrial TV camera 30, and a composite image signal output therefrom is supplied to an image processing circuit 32, thereby measuring a diameter $D_p$ at the crystallization boundary 28, a zone length L between the lower surface of the induction heating coil 12 and the crystallization boundary 24, and a diameter $D_m$ of a crystallization-side melt shoulder portion 34 between a crystallization-side steep sloping portion 38 of the melt and the crystallization boundary 24.

The zone length L is generally proportional to the axial length of the floating zone 20. Therefore the zone length may be set to this axial length or the distance between the melting boundary 28 and the induction heating coil 12.

The diameter $D_m$ of the crystallization-side melt shoulder portion 34 is measured at a position above the crystallization boundary 24 at a constant distance $h_m$ therefrom. There is a constant relationship between the melt shoulder portion diameter $D_m$ and a crystal diameter $D_s$ at the crystallization boundary after a certain period of time (ordinarily, 30 to 100 secs) so long as the distance $h_m$ and the speed $V_s$ of the crystal rod 18 are constant. The correlation between the melt shoulder portion diameter $D_m$ and the crystal diameter $D_s$ at the crystallization boundary is strong, as schematically described below.

That is, if the above diameters are stably maintained at $D_s = 101$ mm and $D_m = 100$ mm and if, from this state, the diameter $D_m$ is increased from 100 mm to 102 mm while the diameter $D_n$ of a melt neck portion is constantly maintained, $D_s = 101 \times 102/100 = 103$ mm is obtained after $h_m/V_s$ has passed. Generally, $V_s = 2.6$ to 5.0 mm/min. In this case, therefore, it is possible to predict, from the melt shoulder portion diameter $D_m$, the crystal diameter $D_s$ at the crystallization boundary exhibited 36 to 39 secs after the time when the melt shoulder portion diameter $D_m$ is measured.

The roundness of the cross-sectional configuration at the crystallization-side melt shoulder portion 34 is higher than that at the crystallization boundary 24 because of the surface tension of the melt. Therefore the crystal diameter can be controlled more accurately with the melt shoulder portion diameter $D_m$ than with the crystal diameter $D_s$ at the crystallization boundary.

Correspondingly, the operation of directly controlling the crystal diameter $D_s$ at the crystallization boundary can be performed with higher response performance and with improved stability compared with the operation of indirectly controlling the crystal diameter $D_s$ by controlling the melt shoulder portion diameter $D_m$.

Preferably, as a result of experiment, the value of the distance $h_m$ is 2 to 5 mm. This value of irrespective of the crystal diameter $D_s$ at the crystallization boundary. So long as this value is set within the range of 1 to 7 mm, the invention is effective to some extent.

Each of the melting-boundary diameter $D_p$ and the melt shoulder portion diameter $D_m$ is measured from the length of a portion of a horizontal scanning line having a luminance greater than a reference value. The position of each of the melting-boundary 28, the crystallization boundary 24 and the lower surface of the induction heating coil 12 is detected as a position at which the luminance of the scanning lines in the vertical direction abruptly changes. The distance $h_m$ corresponds to the distance between a horizontal scanning line corresponding to the crystallization boundary 24 and another horizontal scanning line located above the former with a certain number of other scanning lines interposed therebetween.

SPEED CONTROL FOR DOWNWARD MOVEMENT OF RAW-MATERIAL ROD

The operation of controlling the speed $V_p$ at which the raw-material rod 16 is moved downward will be described below.

Referring to FIG. 1, an operator 40 for calculating the speed at which the raw-material rod moves downward is supplied with a melting-boundary diameter $D_{pi}$ and a melt shoulder portion diameter $D_{mi}$ from the image processing circuit 32, and is also supplied with a downward movement speed $V_{si}$ from a speed detector 42 which detects the speed at which the monocrystalline rod 18 moves downward. The operator 40 calculates $V_s \cdot (D_{mi}/D_{pi})^2$ with values thereby supplied, and supplies a value thereby calculated as a desired downward movement speed $V_{PA}$ to a subtracter 44. The desired downward movement speed $V_{PA}$ is a desired value of the downward movement speed $V_p$ in a case where the volume of the floating zone 20 is constant.

Figure 2:
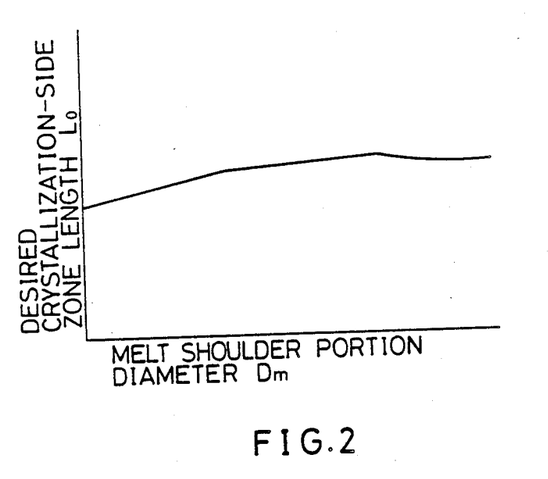
FIG. 2 is a diagram of an input-output characteristic of a zone length setter.

If the volume of the floating zone 20 changes with passage of time, an approximating process is carried out as described below whereby $V_{PB}$ is supplied as a correction value to the subtracter 44. That is, a subtracter 48 is supplied with a measured zone length $L_i$ and a desired crystallization zone length $L_o$ from the image processing circuit 32 and a zone length setter 46, respectively. These values are compared with each other, the difference therebetween is amplified and is thereafter supplied to a PID controller 50, and a signal output from the PID controller 50 is supplied to the subtracter 44. The zone length setter 46 serves as a program setter and outputs, in response to the melt shoulder portion diameter $D_{mi}$ from the image processing circuit 32, the desired zone length $L_o$ that is a function of the melt shoulder portion diameter $D_m$ as shown in FIG. 2.

The value of the desired zone length $L_o$ is constant with respect to the major cylindrical portion but it is not set to be constant with respect to the conical portion. This is because there is an increased possibility of the melt spilling over the conical portion since, at this portion, it is desired to make the melt shoulder portion diameter $D_{mi}$ greater than the diameter $D_{si}$ at the crystallization boundary and, therefore, the desired crystallization zone length $L_o$ is increased specifically at such a portion in order to prevent spill-over of the melt and to avoid occurrence of dislocation in the crystal. However, if the crystallization zone length $L_i$ is increased excessively, various problems occur. For instance, the melt portion may break because it is not adequately retained, or the electromagnetic connection between the coil and the melt portion may be deteriorated. Therefore, it is required to select a suitable value of this length.

The subtracter 44 supplies a differential amplifier 54 with the difference between the desired downward movement speed $V_{PA}$ from the operator 40 and the corrected value $V_{PB}$ from the PID controller 50 as a desired speed $V_{po}$ of downward movement of the raw-material rod. The differential amplifier 54 compares a speed $V_{pi}$ of downward movement of the raw-material rod 16 detected by a downward movement speed detector 52 with the desired speed $V_{po}$ of downward movement of the raw material rod supplied from the subtracter 44, amplifies the difference between these speeds, and supplies this difference as an operational signal to a speed controller 56. The speed $V_p$ at which the raw-material rod 16 is moved downward by the adjustable-speed motor 26 is thereby controlled through a drive circuit 58.

SPEED CONTROL FOR DOWNWARD MOVEMENT OF CRYSTAL ROD

Next, the operation of controlling the speed $V_s$ at which the crystal rod 18 is moved downward will be described below.

The speed $V_{si}$ which is detected by the speed detector 42 and at which the crystal rod 18 is moved downward and a desired speed $V_{so}$ of downward movement of the raw-material rod supplied from a downward movement speed setter 60 are supplied to a differential amplifier 62, and the difference therebetween is amplified and is thereafter supplied as an operational signal to a speed controller 64. An output from the speed controller 64 is supplied to a drive circuit 6, thereby controlling the speed $V_s$ at which the crystal rod 18 is moved downward by the adjustable-speed motor 22. The downward movement speed setter 60 serves as a program setter and outputs, in response to the melt shoulder portion diameter $D_{mi}$ supplied from the image processing circuit 32, the desired speed $V_{so}$ of the downward movement of the crystal rod which is a function of the melt shoulder portion diameter $D_{mi}$.

CONTROL OF CRYSTAL ROD DIAMETER

Next, the operation of controlling the crystal diameter $D_s$ at the crystallization boundary will be described below.

The speed $V_{si}$ of downward movement of the crystal rod 18 is integrated by an integrator 68, and is supplied as an integrated rod length $Y_A$ to a subtracter 70. The integrated rod length $Y_A$ represents the length of the crystal rod 18 when $L_i=0$, and it is corrected by the zone length $L_i$ supplied from the image processing circuit 32. That is, the subtracter 70 supplies a fundamental-supplied-power setter 72 with the difference between the integrated rod length $Y_A$ and the zone length $L_i$ as a crystal rod length Y. The fundamental-supplied-power setter 72 serves as a program setter and supplies a fundamental-supplied-power value which is a function of the crystal rod length Y to a power control input terminal of an oscillator 10 via an adder 78, thereby controlling the power supplied from the oscillator 10 to the induction heating coil 12. The use of the fundamental-supplied-power value enables the measured melt shoulder portion diameter $D_{mi}$ to be approximated to the desired melt shoulder portion diameter $D_{mo}$.

Figure 3:
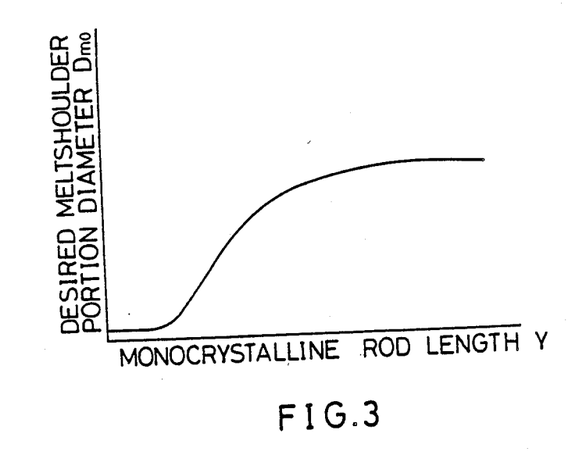
FIG. 3 is a diagram of an input-output characteristics of a melt shoulder portion diameter setter.

The crystal rod length Y is also supplied to a melt shoulder portion diameter setter 80 which serves as program setter and which supplies, in response to the value of the monocrystalline rod length Y, a differential amplifier 82 with the desired melt shoulder diameter $D_{mo}$ that is a function of the crystal rod length Y, as shown in FIG. 3. The differential amplifier 82 supplies PID controller 84 with an operational signal formed from the difference between the desired melt shoulder portion diameter $D_{mo}$ supplied from the melt shoulder portion diameter setter 80 and the detected melt shoulder portion diameter $D_{mi}$ supplied from the image processing circuit 32. An output from the PID controller 84 is supplied to the adder 78, thereby correcting the fundamental-supplied-power value.

In this case, it is required to reduce gains of the PID control action and limit the amplitude of hunting in order to prevent spill-over of the melt. However, if the gains are reduced, the correction becomes inadequate so long as it is based on the output from the PID controller 84. In this embodiment, to cope with this problem, an $I^2$ controller 86 is employed which time-integrates an input value $(D_{mo}-D_{mi})$, further time-integrates the integrated value, multiplies the integrated value by a certain constant and supplies to the final value to the adder 78, thereby correcting the fundamental-supplied-power value.

An experiment of such a correction process was performed. As a result, there was no need for altering fundamental patterns (program setting patterns) written in the fundamental-supplied-power setter 72 even when the induction heating coil 12 was replaced with an alternative coil having different characteristics or when the diameter of the crystal rod was varied.

INTEGRAL SENSITIVITY CONTROL

The process of integral sensitivity control directly relating to the essentials of the present invention will be described below.

This control is performed with an integral sensitivity controller 88 constituted by a microcomputer. The integral sensitivity controller 88 is supplied with the measured zone length $L_i$ and the measured melt shoulder portion diameter $D_{mi}$ from the image processing circuit 32, the desired zone length $L_o$ from the zone length setter 46, the desired melt shoulder portion diameter $D_{mo}$ from the melt shoulder portion diameter setter 80. On the basis of these items of input data, the integral sensitivity controller 88 controls the integral sensitivities of the PID controllers 50 and 84.

Figure 4:
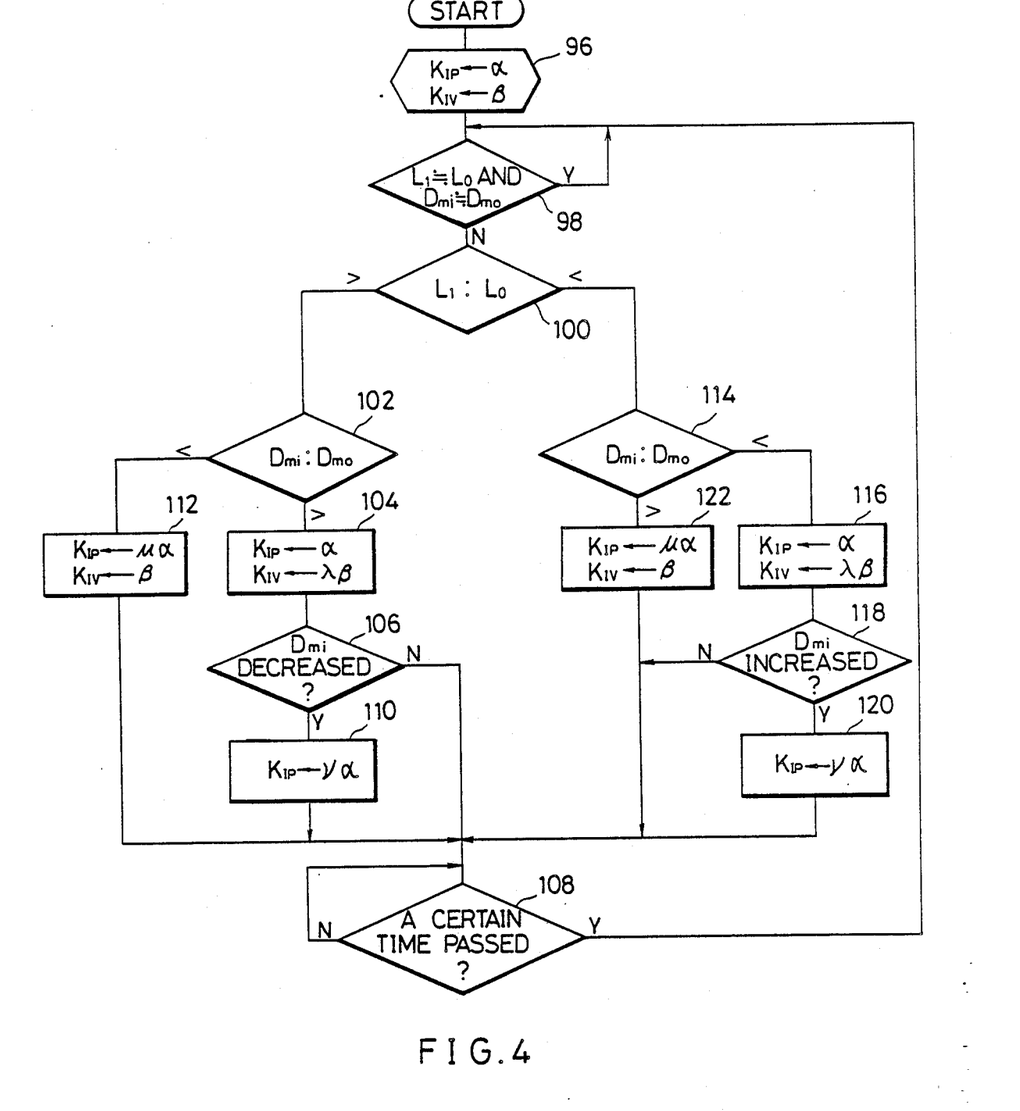
FIG. 4 is a flow chart of the procedure of control with an integral sensitivity controller.

FIG. 4 shows the procedure of this control.

In FIG. 4, $K_{IP}$ represents the integral sensitivity of the PID controller 84 in which a value obtained by multiplying the time-integrated value of an input value by $K_{IP}$ is used as an I-component output value. $K_{IV}$ represents the integral sensitivity of the PID controller 50 in which a value obtained by multiplying the time-integrated value of an input value by $K_{IV}$ is used as an I-component output value. $\alpha$ and $\beta$ are constants. As a result of experiment, it has been found that the preferable range of each of $\alpha$ and $\beta$ is wide and that any value within a range of ±50% of the optimum value is allowable.

First, in step 96, the integral sensitivity $K_{IP}$ is initialized and set to $\alpha$ while the integral sensitivity $K_{IV}$ is initialized and set to $\beta$.

Next, in step 98, if $\Delta$ is sufficiently small relative to $D_{mo}$ and if $$|L_i-L_o|<\Delta \text{ and } |D_{mi}-D_{mo}|<\Delta,$$

that is, $L_i$ is approximately equal to $L_o$ and $D_{mi}$ is approximately equal to $D_{mo}$, control conditions are not changed and kept in the status quo.

The processing performed when $|L_i-L_o|>\Delta$ or $|D_{mi}-D_{mo}|>\Delta$ will be described below with respect to the following four cases.

(1) where $L_i>L_o$ and $D_{mi}>D_{mo}$, the PID controller 50 outputs a signal to reduce the measured zone length $L_i$ (or increase the speed $V_{pi}$ of downward movement of the raw-material rod 16) while the PID controller 84 outputs a signal to reduce the measured melt shoulder portion diameter $D_{mi}$ (or reduce the power P supplied to the induction heating coil 12).

The process proceeds to step 104 through steps 100 and 102, and the integral sensitivity $K_{IP}$ is set to $\alpha$ while the integral sensitivity $K_{IV}$ is set to $\lambda\beta$. $\lambda$ is a constant the effective range of which was found to be, preferably, of 0 to 0.2 which depends upon the values of $\alpha$ and $\beta$. The output from the PID controller 50 which acts to reduce the measured zone length $L_i$ (or reduce $D_{mi}$) is thereby limited, but the output from the PID controller 84 which acts to reduce the measured melt shoulder portion diameter $D_{mi}$ is not limited.

Correspondingly, the increase in the speed $V_{pi}$ of downward movement of the raw-material rod 16 is restricted so that the increase in the measured melt shoulder portion diameter $D_{mi}$ is promptly restricted.

The speed of response of $D_{mi}$ to a change in $V_{pi}$ is far greater than the speed of response of $D_{mi}$ to a change in the supplied power P.

For this reason, the influence of the reduction in the supplied power on the basis of the output from the PID controller 84 becomes apparently very large, and the measured melt shoulder portion diameter $D_{mi}$ is promptly converged to the desired melt shoulder portion diameter $D_{mo}$.

In step 106, the process proceeds to step 108 if the measured melt shoulder portion diameter $D_{mi}$ is still greater than the preceding read value. Then, after waiting for a certain period of time, the process returns to step 98. The length of this waiting time depends upon the period of time for one cycle between steps 98 and 108 and there is no problem even if it is zero.

If the measured melt shoulder portion diameter $D_{mi}$ has stopped increasing and started decreasing by the reduction in the supplied power P, the process proceeds from step 106 to step 110, and the value of the integral sensitivity $K_{IP}$ is reduced to $\nu\alpha$, thereby preventing the measured melt shoulder portion diameter $D_{mi}$ from decreasing excessively. This is because the speed of response of $D_{mi}$ to the change in the supplied power P is relatively small. The measured melt shoulder portion diameter $D_{mi}$ is thereby converted stably to the desired melt shoulder portion diameter $D_{mo}$. The above $\nu$ is a constant which is set within an effective range of 0 to 0.5, or more preferably, 0.1 to 0.3 which depends upon the values of $\alpha$ and $\beta$.

(2) where $L_i > L_o$ and $D_{mi} < D_{mo}$, the PID controller 50 outputs a signal to reduce the measured zone length $L_i$ (or increase the speed $V_{pi}$ of downward movement of the raw-material rod 16) while the PID controller 84 outputs a signal to increase the measured melt shoulder portion diameter $D_{mi}$ (or increase the power P supplied to the induction heating coil 12).

The process proceeds to step 112 through steps 100 and 102, and the integral sensitivity $K_{IP}$ is set to $\mu\alpha$ while the integral sensitivity $K_{IV}$ is set to $\beta$. $\mu$ is a constant which is set within an effective range of 0 to 0.5, or more preferably, 0 to 0.2 which depends upon the values of $\alpha$ and $\beta$. The output from the PID controller 84 which acts to increase the measured melt shoulder portion diameter $D_{mi}$ is thereby limited although the output from the PID controller 50 which acts to reduce the measured zone length $L_i$ is not limited.

Correspondingly, the measured melt shoulder portion diameter $D_{mi}$ rapidly increases in response to the increase in the speed $V_{pi}$ of downward movement of the raw-material rod 16. At this time, however, the increase in the supplied power P is limited, thereby inhibiting the measured melt shoulder portion diameter $D_{mi}$ from increasing excessively. The measured melt shoulder portion diameter $D_{mi}$ is thereby converted stably and rapidly to the desired melt shoulder portion diameter $D_{mo}$.

The process then proceeds to step 108. After waiting for the certain period of time, the process returns to step 98.

(3) where $L_i < L_o$ and $D_{mi} > D_{mo}$, the PID controller 50 outputs a signal to increase the measured zone length $L_i$ (or reduce the speed $V_{pi}$ of downward movement of the raw-material rod 16) while the PID controller 84 outputs a signal to reduce the measured melt shoulder portion diameter $D_{mi}$ (or reduce the power P supplied to the induction heating coil 12).

The process proceeds to step 122 through steps 100 and 114, and the integral sensitivity $K_{IP}$ is set to $\mu\alpha$ while the integral sensitivity $K_{IV}$ is set to $\beta$. The output from the PID controller 84 which acts to reduce the measured melt shoulder portion diameter $D_{mi}$ is thereby limited although the output from the PID controller 50 which acts to increase the measured zone length $L_i$ is not limited.

Correspondingly, the measured melt shoulder portion diameter $D_{mi}$ rapidly decreases in response to the reduction in the speed $V_{pi}$ of downward movement of the raw-material rod 16. At this time, however, the increase in the supplied power P is limited, thereby inhibiting the measured melt shoulder portion diameter $D_{mi}$ from decreasing excessively. The measured melt shoulder portion diameter $D_{mi}$ is thereby converted stably and rapidly to the desired melt shoulder portion diameter $D_{mo}$.

The process then proceeds to step 108. After waiting for the certain period of time, the process returns to step 98.

(4) where $L_i < L_o$ and $D_{mi} < D_{mo}$, the PID controller 50 outputs a signal to increase the measured zone length $L_i$ (or reduce the speed $V_{pi}$ of downward movement of the raw-material rod 16) while the PID controller 84 outputs a signal to increase the measured melt shoulder portion diameter $D_{mi}$ (or increase the power P supplied to the induction heating coil 12).

The process proceeds to step 116 through steps 100 and 114, and the integral sensitivity $K_{IP}$ is set to $\alpha$ while the integral sensitivity $K_{IV}$ is set to $\lambda\beta$. The output from the PID controller 50 which acts to increase the measured zone length $L_i$ is thereby limited, but the output from the PID controller 84 which acts to increase the measured melt shoulder portion diameter $D_{mi}$ is not limited.

Correspondingly, the reduction in the downward movement of the raw-material rod 16 is restricted so that the further reduction in the measured melt shoulder portion diameter $D_{mi}$ is promptly restricted.

For this reason, the influence of increase in the supplied power on the basis of the output from the PID controller 84 becomes apparently very large, and the measured melt shoulder portion diameter $D_{mi}$ is promptly converged to the desired melt shoulder portion diameter $D_{mo}$.

In step 118, the process proceeds to step 108 if the measured melt shoulder portion diameter $D_{mi}$ is still greater than the preceding read value. The process proceeds to step 120 is the measured melt shoulder portion diameter $D_{mi}$ has exceeded the preceding read value in which the value of integral sensitivity $K_{IP}$ is reduced to $\nu\alpha$ in order to prevent the measured melt shoulder portion diameter $D_{mi}$ from decreasing excessively. The process thereafter proceeds to step 108. After waiting for the certain period of time, the process returns to step 98.

As a result of this processing, the melt shoulder portion diameter $D_{mi}$ is stably and rapidly converged to the desired value. The zone length L also changes by following the corresponding desired value. However, there is no problem of the control of the zone length L because the zone length L changes at a very high speed in response to the change in the speed of downward movement of the raw-material rod 16 and because is it sufficient to control the zone length with lower accuracy compared with the control of the melt shoulder portion diameter $D_{mi}$.

In accordance with the present invention, to improve the response performance and the stability of control of the melt shoulder portion diameter $D_{mi}$, the accuracy with which the zone length L is controlled is sacrificed to some extent, resulting in an improvement in the overall control performance.

It is therefore possible to minimize the length of the conical portion which cannot be utilized as the product while preventing the melt in the floating zone from spilling over. In addition, in the manufacture of the major cylindrical portion, it is possible to reduce irregularities formed in the surface of this portion in the axial direction and, hence, the depth to which the surface of the cylindrical portion is polished to eliminate such irregularities.

DIAMETER $D_n$ OF MELT NECK PORTION

The above-described embodiment exemplifies the case where the zone length L is directly used, but it is preferable to used the diameter $D_n$ of the melt neck portion shown in FIG. 1.

The melt neck portion diameter $D_n$ is defined as the diameter of a crystallization-side melt neck portion 36 located under the lower surface of the induction heating coil 12 at a distance $h_n$ therefrom. The melt neck portion diameter $D_n$ is measured as a value proportional to the length of the horizontal scanning line having a luminance higher than the reference level. The distance $h_n$ corresponds to the distance between a scanning line corresponding to the lower surface of the induction heating coil 12 and another scanning line located above the former with a certain number of other scanning lines interposed therebetween. There is a constant relationship between the melt neck portion diameter $D_n$ and the zone length after a certain period of time (ordinarily, 5 to 10 secs). The correlation therebetween is large, as schematically described below.

That is, if the power P supplied to the induction heating coil 12 is reduced in order to inhibit any increase in $D_m$ which increases in response to an increase in the $D_n$, the zone length L is reduced. This increase $\Delta D_n$ in $D_n$ is proportional to a reduction $\Delta L$ in L exhibited after a certain period of time.

In the case where the distance $h_m$ is several millimeters, as a result of experiment, $\Delta D_n/\Delta L$ is about 10 and the sensitivity of $D_n$ is higher than that of L by one place.

In the display with the industrial TV camera showing the floating zone 20 and the region containing this zone, the lines representing the crystallization boundary 24 and the melting boundary 28 are curved is the diameters of the material rods 16 and 18 are large and, for example, 150 mm. These lines have irregularities due to crystal habit or the like. There is no such problem with respect to the melt neck portion 36. It is therefore preferable to use $D_n$ as a feed back quantity rather than L.

As can be understood from these facts, in the manufacture of the major cylindrical portion, the operation of indirectly controlling the zone length L by controlling the melt neck portion diameter $D_n$ can be performed with improved stability compared with the the operation of directly controlling the zone length.

The above distance $h_n$ is determined under the condition that the value of $\Delta D_n/\Delta L$ is large, namely, the sensitivity is high and, at the same time, the measured value is stable. More specifically, it is preferable to set the neck portion closer to the portion having the minimum diameter defined at a distance of less than several millimeters from the lower surface of the induction heating coil 12.

The present invention can of course be modified in other various ways.

In the above-described embodiment, the integral sensitivity is changed depending upon the control deviations of the zone length L and the melt shoulder portion diameter $D_m$. Alternatively, the proportional sensitivity or the differential sensitivity may be changed or the combination of these sensitivities may be changed.

The control system is not limited to the PI or PID type.

In the above description, the melt shoulder portion diameter $D_m$ is used as the quantity relating to the crystal diameter. However, instead of this, the crystal diameter $D_s$ at the crystallization boundary may be used.

The fundamental supplied power may be a function of the melt shoulder portion diameter $D_m$ of the crystal diameter $D_s$ at the crystallization boundary instead of the function of the crystal rod length.

What is claimed is:

1. A method of controlling a floating zone, comprising the steps of: supplying a high frequency current to an induction heating coil (12) to form a melt from a raw-material rod (16) from one side thereof so that a crystal rod (18) crystallizes and grows from said melt; axially moving said raw-material rod toward the melting side and said crystal rod in the direction opposite to the melting side relative to said induction heating coil; imaging, with an imaging device (30), a floating zone (20) having a thin portion and formed between said rods; measuring geometric quantities of said floating zone from the image obtained by said imaging device; and controlling the electric power (P) supplied to said induction heating coil and the speed ($V_p$) at which said raw-material rod is moved relative to said induction heating coil so that said geometric quantities become equal to desired values, said method being characterized in that said geometric values include one $Z_i$ of the axial length of said floating zone, the distance (L) between said induction heating coil and a crystallization boundary (24) and the diameter ($D_n$) of a melt neck portion located on the side of said crystallization boundary at a predetermined distance from said induction heating coil, and one $D_i$ of the diameter ($D_s$) of said crystallization boundary and the diameter ($D_m$) of a melt shoulder portion (34) located between said crystallization boundary and said thin portion at a predetermined distance ($h_m$) from said crystallization boundary, and that if a desired value of said $Z_i$ is $Z_o$, a desired value of said $D_i$ is $D_o$ and $M=(Z_i-Z_o)(D_i-D_o)$, the contribution of control of said relative speed ($V_p$) is smaller when $Z_i=Z_o$ and $D_i=D_o$ are not satisfied substantially and $M>0$ than it is when $Z_i=Z_o$ and $D_i=D_o$ are satisfied substantially (104, 106), and the contribution of control of said electric power (P) is smaller when $Z_i=Z_o$ and $D_i=D_o$ are not satisfied substantially and $M<0$ than it is when $Z_i=Z_o$ and $D_i=D_o$ are satisfied substantially (112, 122).

2. A method of controlling a floating zone according to claim 1, wherein said control comprises one of PI control, PII$^2$ control, PID control and PII$^2$D control, and said contribution to said control is reduced by reducing the integral sensitivity.

3. A method of controlling a floating zone according to claim 2, wherein the integral sensitivity in said control of said relative speed ($V_p$) when $Z_i=Z_o$ and $D_i=D_o$ are not satisfied substantially and $M>0$ is higher than that when $Z_i=Z_o$ and $D_i=D_o$ are satisfied substantially by 0 to 0.2 times (104, 116), and the integral sensitivity in said control of said electric power (P) when $Z_i=Z_o$ and $D_i=D_o$ are not satisfied substantially and $M<0$ is higher than that when $Z_i=Z_o$ and $D_i=D_o$ are substantially satisfied by 0 to 0.2 times (112, 122).

4. A method of controlling a floating zone according to claim 3, wherein when $Z_i=Z_o$ and $D_i=D_o$ are not satisfied substantially, $Z_i>Z_o$ and $D_i>D_o$ and when $D_i$ is reduced by said control, the contribution of control of said electric power (P) is reduced from the value prior to said reduction in $D_i$ (110), and when $Z_i=Z_o$ and $D_i=D_o$ are not satisfied substantially, $Z_i<Z_o$ and $D_i<D_o$ and when $D_i$ is increased by said control, the contribution of control of said electric power (P) is reduced from the value prior to said increase in $D_i$ (120).

5. A method of controlling a floating zone according to claim 4, wherein said contribution of control of said electric power (P) is reduced by multiplying by 0.1 to 0.3 the integral sensitivity in said control when $Z_i=Z_o$ and $D_i=D_o$ are satisfied substantially.

6. A method of controlling a floating zone according to claim 1, wherein said relative speed ($V_p$) is controlled so that said measured value $Z_i$ becomes equal to said desired value $Z_o$ while said electric power (P) is controlled so that said measured value $D_i$ becomes equal to said desired value $D_o$.

7. A method of controlling a floating zone according to claim 6, wherein said control comprises one of PI control, PII$^2$ control, PID control and PII$^2$D control, and said contribution to said control is reduced by reducing the integral sensitivity.

8. A method of controlling a floating zone according to claim 7, wherein the integral sensitivity in said control of said electric power (P) when $Z_i=Z_o$ and $D_i=D_o$ are not satisfied substantially and M>0 is higher than that when $Z_i=Z_o$ and $D_i=D_o$ are satisfied substantially by 0 to 0.2 times (104, 116), and the integral sensitivity in said control of said relative speed ($V_p$) when $Z_i=Z_o$ and $D_i=D_o$ are not satisfied substantially and M<0 is higher than that when $Z_i=Z_o$ and $D_i=D_o$ are satisfied substantially by 0 to 0.2 times (112, 122).

9. A method of controlling a floating zone according to claim 8, wherein when $Z_i=Z_o$ and $D_i=D_o$ are not satisfied substantially, $Z_i>Z_o$ and $D_i>D_o$ and when $D_i$ is reduced by said control, the contribution of control of said electric power (P) is reduced from the value prior to said reduction in $D_i$ (110), and when $Z_i=Z_o$ and $D_i=D_o$ are not satisfied substantially, $Z_i<Z_o$ and $D_i<D_o$ and when $D_i$ is increased by said control, the contribution of control of said electric power (P) is reduced from the value prior to said increase in $D_i$ (120).

10. A method of controlling a floating zone according to claim 9, wherein said contribution of control of said electric power (P) is reduced by multiplying by 0.1 to 0.3 the integral sensitivity in said control when $Z_i=Z_o$ and $D_i=D_o$ are satisfied substantially.

* * * * *